(12) United States Patent
Desai et al.

(10) Patent No.: US 7,310,767 B2
(45) Date of Patent: Dec. 18, 2007

(54) DECODING BLOCK CODES

(75) Inventors: Vipul A. Desai, Palatine, IL (US);
Yufei W. Blankenship, Streamwood, IL (US); Brian K. Classon, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 478 days.

(21) Appl. No.: 10/899,376

(22) Filed: Jul. 26, 2004

(65) Prior Publication Data

US 2006/0020869 A1   Jan. 26, 2006

(51) Int. Cl.
*H03M 13/00* (2006.01)
*H03M 13/03* (2006.01)

(52) U.S. Cl. .................. 714/782; 714/784; 714/780; 714/794

(58) Field of Classification Search ............. 714/782, 714/784, 780, 794
See application file for complete search history.

(56) References Cited

U.S. PATENT DOCUMENTS

| 5,563,897 | A | 10/1996 | Pyndiah et al. |
| 5,930,272 | A | 7/1999 | Thesling |
| 6,065,147 | A | 5/2000 | Pyndiah et al. |
| 6,122,763 | A | 9/2000 | Pyndiah et al. |
| 2001/0050622 | A1 | 12/2001 | Hewitt et al. |
| 2002/0026615 | A1 | 2/2002 | Hewitt et al. |
| 2002/0124223 | A1 | 9/2002 | Thesling et al. |
| 2003/0070131 | A1* | 4/2003 | Fujita et al. ................ 714/755 |
| 2003/0126546 | A1* | 7/2003 | Fujita et al. ................ 714/786 |
| 2005/0031025 | A1* | 2/2005 | Xie et al. ................... 375/222 |
| 2006/0020874 | A1* | 1/2006 | Desai et al. ................ 714/780 |

FOREIGN PATENT DOCUMENTS

WO    WO0019616 A3    11/2000

OTHER PUBLICATIONS

Kaneko, T.; Nishijima, T.; Inazumi, H.; Hirasawa, S.; An efficient maximum-likelihood-decoding algorithm for linear block codes with algebraic decoder; IEEE Transactions on Information Theory, vol. 40, Issue 2, Mar. 1994 pp. 320-327.*

(Continued)

*Primary Examiner*—Joseph D. Torres

(57) ABSTRACT

A method and structure of processing soft information in a block code decoder, includes a soft-input soft-output decoder receiving a length n soft input vector, creating a binary vector Y corresponding to the soft input vector, hard decoding each linear function Xi of Y and a test pattern Zi of one or more test patterns, wherein if the hard decoding is successful a codeword produced by the hard decoding of Xi is added to a set S, removing redundant codewords in S to form a reduced set S' based on processing a number of errors found during the hard decoding and a guaranteed error correcting capability of the block code decode, and an extrinsic value estimator generating n soft outputs based on c estimated soft output values and (n-c) non-estimated soft output values wherein the c estimated soft output values are computed from one or more positions of soft input vector and one or more codewords in S'.

25 Claims, 8 Drawing Sheets

OTHER PUBLICATIONS

Gazelle, David et al. "Reliability-Based Code-Search Algorithms for Maximum-Likelihood Decoding of Block Codes". *IEEE Transactions on Information Theory*, Jan. 1997, pp. 239-249, vol. 43, No. 1.

Chase, David. "A Class of Algorithms for Decoding Block Codes with Channel Measurement Information." IEEE Transactions on Information Theory, Jan. 1972, pp. 170-182, vol. IT-18, No. 1.

Elias, Peter. "Error-Free Coding". Department of Electrical Engineering and Research Laboratory of Electronics, Massachusetts Institute of Technology, Cambridge, Massachusetts, pp. 29-37, no date.

Hagenauer, Joachim. "Iterative Decoding of Binary Block and Convolutional Codes". IEEE Transactions on Information Theory, Mar. 1996, pp. 429-445, vol. 42, No. 2.

IEEE Transactions on Information Theory, Mar. 1974, pp. 284-287.

Kaneko, Toshimitsu, et al. "An Improvement of Soft-Decision Maximum-Likelihood Decoding Algorithm Using Hard-Decision Bounded-Distance Decoding". IEEE Transactions on Information Theory, Jul. 1997, pp. 1314-1319, vol. 43, No. 4.

Pyndiah, Ramesh Mahendra. "Near-Optimum Decoding of Product Codes: Block Turbo Codes". IEEE Transactions on Communications, Aug. 1998, pp. 1003-1010, vol. 46, No. 8.

"TIA Standard". Telecommunications Industry Association, Mar. 11, 2003, pp. 1-49, WAI SAM CHC Specification, TIA-902.BAAD.

* cited by examiner

DECODING BLOCK CODES

CROSS REFERENCE TO RELATED APPLICATION

This application is related to co-pending application CML015867, titled "IMPROVING DECODER PERFORMANCE FOR BLOCK PRODUCT CODES," filed even date herewith and having the same ownership as the present application and to that extent related to the present application.

BACKGROUND

Error correcting codes modify a message by adding memory and/or redundancy so that errors that occur during transmission over a channel can be detected and possibly corrected. One such error correcting code is called a product code. A representative product code is defined in the ANSI/TIA-902.BAAD standard. A product code is a multidimensional error correcting code where each dimension of the code is constructed using a constituent code. Block codes, such as Bose Chaudhuri Hocquenghem (BCH) codes, are often used as constituent codes of a product code. A product code can have a different constituent code in each dimension. Product codes are also called block product codes, block turbo codes, and block product turbo codes in the art.

Decoding product codes is a complex task and can be performed iteratively using soft-input soft-output (SISO) constituent decoders operating on constituent codewords. A soft input for the subsequent decoding phase may be computed using the soft output from the current decoding phase in a similar manner to the decoding process for turbo codes.

The soft input and soft output of each bit position in a given codeword can be, for example, a likelihood ratio or log-likelihood ratio (LLR) as is commonly used in maximum likelihood (ML) decoding and maximum a posterior (MAP) decoding. When LLRs are used, the soft input is called the input LLR, and the soft output is called the output LLR. The extrinsic LLR of a given bit position is a function of the LLRs of the other bits in the codeword, is generated from the input LLR, and is used to compute the input LLR for the next phase of the decoding iteration. In one example, the extrinsic LLR is the difference between the output LLR and input LLR.

One soft-input soft-output (SISO) decoder for constituent codes is a Chase decoder. Upon receiving a length n soft input vector for a given constituent block code, a binary vector Y and a set of test patterns $Z_i$ are formed (created) from the soft input vector in the Chase decoder. The forming of test patterns is performed by a Chase algorithm within the Chase decoder. A hard-input hard-output (HIHO) block decoder is used to decode each binary vector $X_i=(Y+Z_i)$, where the "+" for a binary vector can represent the exclusive-or operator. If the hard-input hard-output decoder is successful, the resulting codeword $C_i$ from the hard decoding of $X_i$ is saved in a set S. In addition to each codeword in S, an associated metric is saved, where the associated metric can be computed from the soft input, the test pattern, and the resulting codeword. In certain embodiments, a hard-input hard-output decoder can be called a hard decoder.

The soft output Chase decoder calculates the soft output for each bit j in the received codeword based on two or more codewords in S and the associated metrics. One codeword is the best estimate D, which is practically always found unless the set S is empty. The other is a competing codeword $C_j$ that has the best metric among all codewords in S that differ from D at position j. In the Chase decoder, the competing codeword $C_j$ is frequently not found due to the limited number of test patterns the Chase decoder examines. The soft output calculation is typically the most complex aspect of Chase decoding. Hence, there is a need to reduce the complexity of the soft output calculation. Since a competing codeword $C_j$ may not be found for each position, there are typically many positions without a non-estimated (valid) soft output value. For applications that need soft output value for each bit position, such as decoding product codes, there is a need to estimate the soft output value for the positions without a valid soft output value. After Chase decoding, the output LLR vector comprises c unavailable output LLR values and n−c valid output LLR values. As a result, there are only n−c valid extrinsic LLR values available for subsequent decoding. In order to decode successfully, the extrinsic LLR needs to be estimated for the c unavailable output LLR values.

FIG. 1 shows a basic flowchart 100 of a Chase decoder illustrating examining the set of test patterns (block 110) to produce a set S of candidate codewords and generating the soft output vector (block 120) from the set S wherein processing the test patterns and generating the soft output are decoupled.

FIG. 2 provides an exemplary flowchart 200 depicting processing the test patterns. A binary vector Y is generated (block 205) and a set of test patterns $Z_i$ are formed from the soft input vector in the Chase decoder (block 210). The forming of test patterns is performed by a Chase algorithm within the Chase decoder. An index i is initialized to 1 (block 215), and a hard-input hard-output (HIHO) block decoder is used to decode each binary vector $X_i=(Y+Z_i)$ (block 220), where the "+" for a binary vector can represent the exclusive-or operator. If the hard-input hard-output decoder is successful (block 225), the resulting codeword $C_i$ from the hard decoding of $X_i$ is saved in a set S and an associated metric is also saved (block 230). The associated metric can be computed from the soft input, the test pattern, and the resulting codeword. A successful decoding is when a codeword is produced by the decoder; otherwise, there is nothing to save to the set S. An example of a decoder that has unsuccessful decodings (or decoding failures) would be a bounded distance (BD) decoder that only produces a codeword when $X_i$ is within Hamming weight t of a codeword. The index i is then incremented (block 235) and while the index i is less than or equal to the number of test patterns (block 240), the HIHO decoding process (blocks 220-230) is performed on each test pattern.

The Chase decoder attempts to calculate the soft output for each bit j in the received codeword based on two or more codewords in S. A simplified Chase decoder can use one codeword that is the best estimate D (which is practically always found unless the set S is empty), and another (per bit j) that is the best competing codeword $C_j$ which has the best metric among all codewords in S that differ from D at position j. A non-simplified Chase decoder considers every unique codeword found to be a competing codeword and updates the metric value $M_j$ at position j accordingly.

As mentioned previously, in some situations the Chase decoder may be unable to calculate the soft output because there is no competing codeword $C_j$ in S which differs from D at position j. FIG. 3 provides an exemplary flowchart 300 depicting processing the codewords in S.

With reference to FIG. 3, $M_j$ represents the best competing metric at position j, where j ranges from 1 to n. The index q ranges over the number of codewords in set S. Without loss of generality, the set S is arranged so that the first codeword (q=1) in S is assumed to the best codeword D. Starting with the first position (j=1) in a codeword (block 305), metric $M_j$ is initialized and q refers to the second codeword $C_q$ in S (block 310). If $C_q$ is a competing codeword at position j (block 315), then metric $M_j$ is updated (block 320) and q is incremented (block 325). In certain embodiments if the number of codewords in set S is 0 or 1, the loop beginning before block 315 should not get executed. Otherwise, if $C_q$ is not a competing codeword, then q is incremented (block 325).

The process of checking the codewords in the set S and updating metric $M_j$ at position j as needed is repeated for each codeword in S (blocks 315-330). When all codewords in S have been checked at bit position j (No in block 330), the jth soft output value is computed (block 335) and the bit position index is incremented (block 340). The codeword evaluation is then repeated for the next bit position (blocks 310-335) until index j exceeds the codeword length n (block 345). In block 335, computing the j-th soft (output) value can use metric $M_j$.

FIG. 4 illustrates a method 400 for estimating soft output values within a product code. First the process performs all constituent SISO decodings (for example, with a Chase decoder) in one dimension of a product code (block 405). The soft outputs can contain a combination of non-estimated (valid) soft output values and invalid soft output values. A valid soft output value is produced if the SISO decoder is able to find a competing codeword for that bit position. An invalid soft output value occurs if the SISO decoder is unable to find a competing codeword for that bit position. Next, the process finds all the valid soft output values within the product code (block 410). Next, the valid soft output values are processed. One processing method involves computing the valid extrinsic values from the valid soft output values and corresponding soft input values (block 415). Next, the mean of the magnitudes of the valid extrinsic values is computed. Next, an estimated extrinsic value is computed based on scaling and normalizing the mean (block 420). The scaling operation can simply be a multiplication by a constant. The normalizing operation often involves a division by a value that can be variable and dependent on the received vector for example. The last operation replaces the invalid soft output values with estimated soft output values that are based on the estimated extrinsic value (block 425).

The normalization operation can cause the product code decoder to be scale intolerant. A scale-intolerant operation is non-homogenous, i.e., if f(x)=y, then f(ax)≠ay. In contrast, a scale-tolerant operation is homogenous, i.e., f(x)=y, then f(ax)=ay for values of a. A non-homogenous operation is also non-linear, in that if $f(x_1)=y_1$ and $f(x_2)=y_2$, then $f(ax_1+bx_2) \neq ay_1+by_2$. For example, x can repres input (LLR), y can represent an output (LLR), and f(•) can represent a decoder. Scale-tolerant operations are desirable for many reasons. Among the reasons is scale tolerance facilitates fixed-point implementations, such as on a Motorola Model DSP56600 digital signal processor.

BRIEF DESCRIPTION OF THE DRAWINGS

Certain embodiments illustrating organization and method of operation, together with objects and advantages may be best understood by reference to the detailed description that follows taken in conjunction with the accompanying drawings in which.

DETAILED DESCRIPTION OF EXEMPLARY EMBODIMENTS

Figure 1:
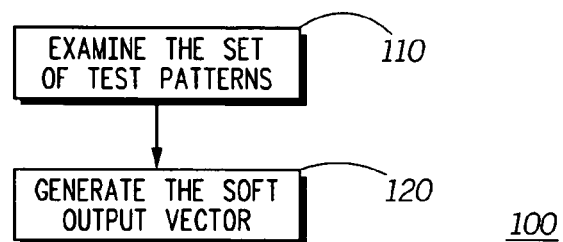
FIG. 1 is a flow diagram of the basic operation of a Chase decoder.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

As used herein, a message is a sequence of information symbols to be encoded, S is a set of codewords, S' is a subset of S, n is the length of a constituent codeword, Y is a binary vector, $Z_i$ is an element from a set of test patterns, D is a best estimate of a codeword, $C_i$ is a codeword, $C_j$ is a competing codeword at a position j within a codeword, c is a number of positions wherein a competing codeword has not been found, t is a guaranteed error correcting capability of the code, s is a number of errors found during decoding a codeword, $d_{min}$ is a minimum distance of the code, and $M_j$ represents a best competing metric at position j.

For binary codes, a weight function wt[x] indicates the number of ones in the vector x. For example, if x=[0, 1, 1, 0, 0, 0], then wt[x]=2. The weight function is also called a Hamming weight. A linear add is $X_i=(Y+Z_i)$ where addition is the exclusive-or operation for codes over GF(2) or the extension field of $GF(2^P)$, where GF denotes a Galois Field.

Certain embodiments of the present invention are designed to support two or more than two dimensional (multidimensional) product codes. In addition, certain embodiments may be applicable to any combination of constituent codes including the use of Hamming, BCH, Golay codes, and any other block code. In certain embodiments, the information may be extrinsic information passed out of a constituent block code decoder (soft-input soft-output decoder) in a product code decoder, or may be the actual soft outputs in any soft-input soft-output decoder of a block code.

Certain embodiments consistent with the present invention improve SISO decoder complexity and performance within a constituent decoder by:

1) efficiently eliminating redundant codewords before the soft output loop of a constituent decoder; and
2) providing an improved estimate of the soft information of the bit positions of codewords after SISO decoding.

However, this should not be considered limiting since the presence or absence of such improvements should not be considered a requirement.

Figure 5:
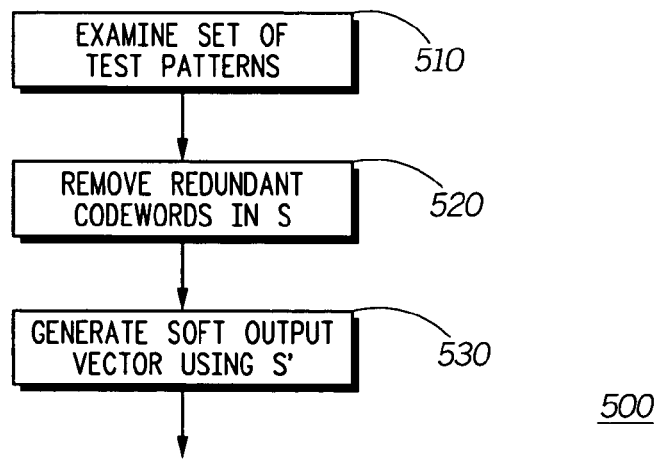
FIG. 5 is a flow diagram of a Chase decoder, according to certain embodiments.
Figure 6:
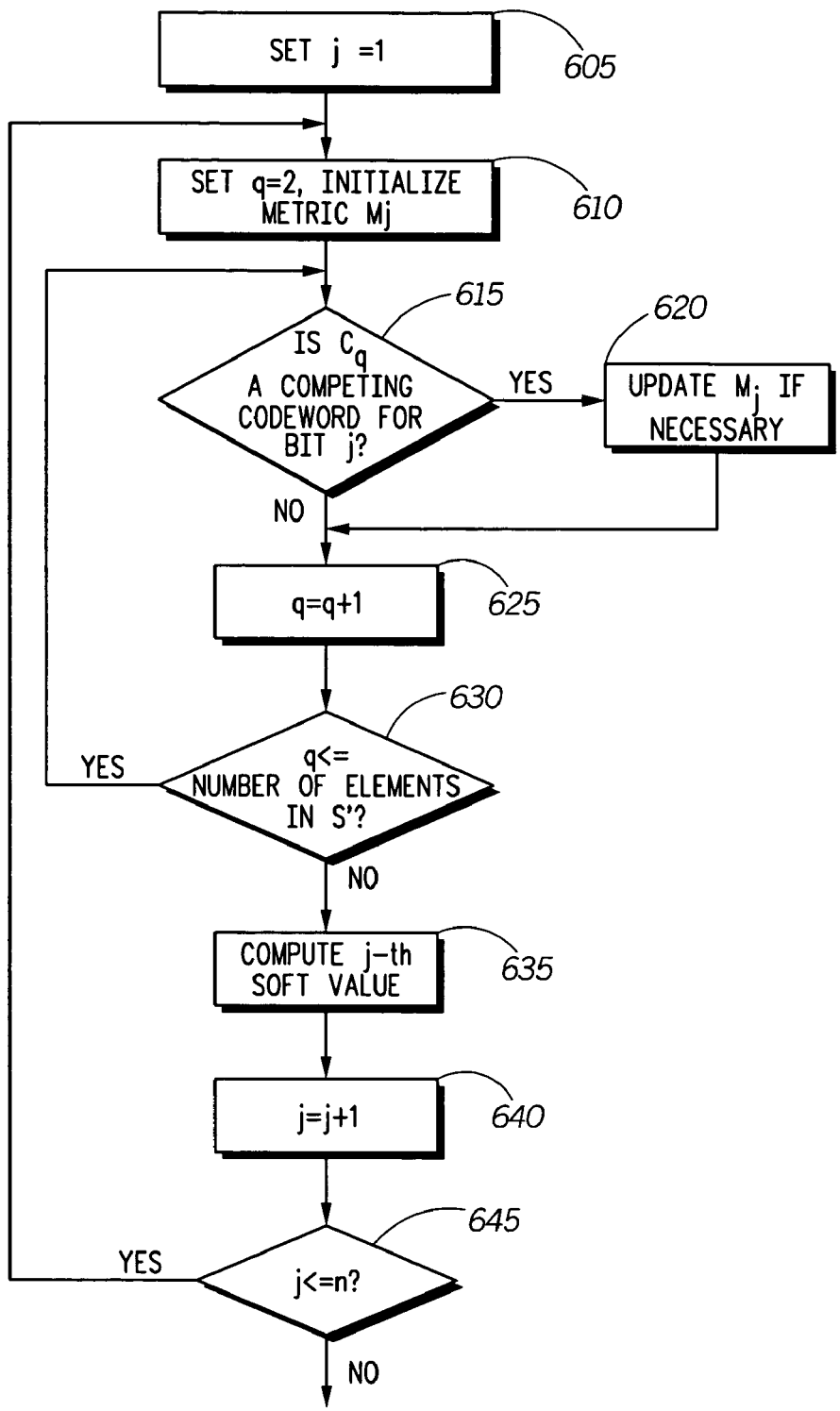
FIG. 6 is a flow diagram of generating a soft output vector of a Chase decoder, according to certain embodiments.

FIG. 5 provides an exemplary flowchart 500 showing an extra redundant codeword elimination process before generating the soft output using a reduced set S', in accordance with certain embodiments. In FIG. 5, examining test patterns to create a set S (block 510) occurs before removing redundant codewords in S to create the reduced set S' (block 520). A soft output vector is then formed from the reduced set S' (block 530). In another embodiment of the present invention, examining the set of test patterns and removing redundant codewords can be combined into a single action. FIG. 6 shows an exemplary flowchart 600 illustrating the soft output generation (block 530) using the reduced set S', in accordance with certain embodiments.

With reference to FIG. 6, $M_j$ represents the best competing metric at position j, where j ranges from 1 to n. In certain embodiments of the present invention, metric $M_j$ can be initialized to a signed indicator value. Index q ranges over the number of codewords in set S'. Without loss of generality, the set S' is arranged so that a first codeword (q=1) in S' is assumed to be a codeword D closest to a candidate codeword, i.e., the first codeword in S' can be designated as the most likely codeword. In one example, the most likely codeword can have the smallest associated metric. Starting with a first position (j=1) in a codeword (block 605), metric $M_j$ is initialized and q refers to second codeword $C_q$ in S' (block 610). If $C_q$ is a competing codeword at position j (block 615), then metric $M_j$ is updated (block 620) and q is incremented (block 625). In certain embodiments if the number of codewords in set S' is 0 or 1, the loop beginning before block 615 should not get executed. Otherwise, if $C_q$ is not a competing codeword, then q is incremented (block 625).

The process of checking codewords in the set S' and updating metric $M_j$ at position j as needed is repeated for each codeword in S' (blocks 615-630). When all codewords in S' have been checked at bit position j (No in block 630), the jth soft output value is computed (block 635) and bit position index j is incremented (block 640). Codeword evaluation of blocks 610-635 is then repeated until index j exceeds codeword length n (block 645). In block 635, computing the j-th soft value can use metric $M_j$. It is noted that the n soft values of a codeword can represent either soft output values or extrinsic values depending upon the implementation. Further, in one example, if a competing codeword is not found at position j, the soft output value can be set to a signed indicator in block 635. The signed indicator can be a signed indicator value to distinguish it from the other positions. The signed indicator can also be represented by a table of positions and signs of those positions. In one example, when a signed indicator is used for position j, its sign can be related to the bit in the j-th position of the most likely codeword.

Figure 2:
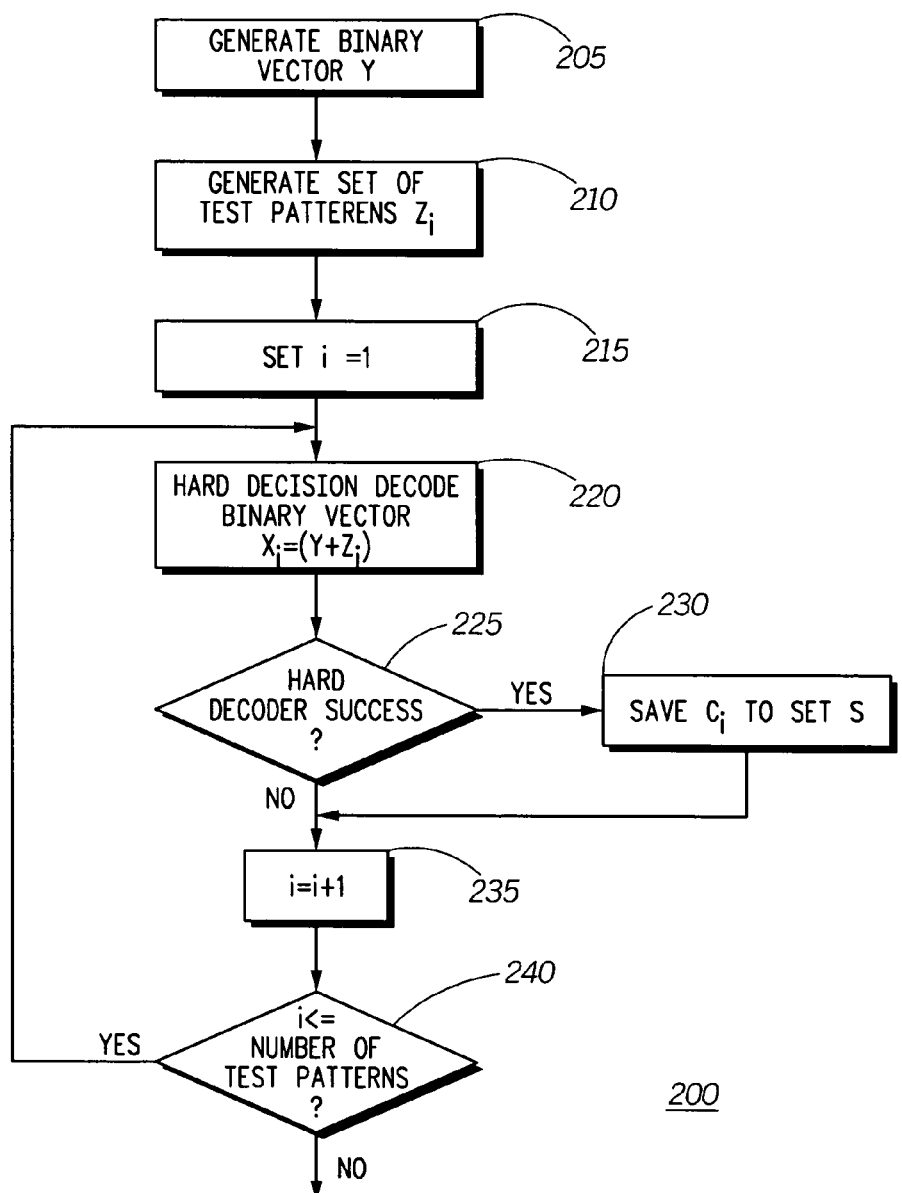
FIG. 2 is a simplified flow diagram of the process of examining the test patterns of a Chase decoder.
Figure 3:
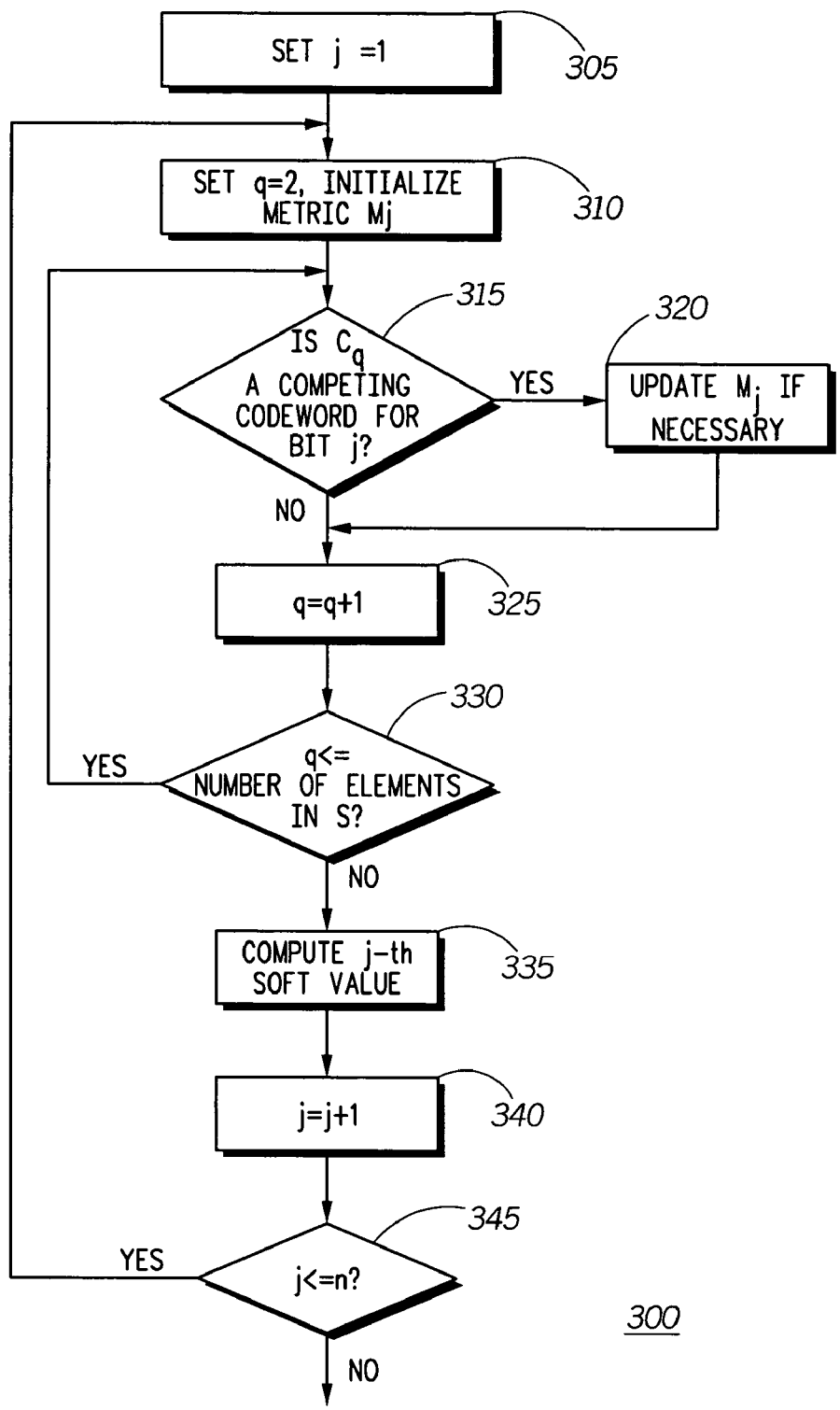
FIG. 3 is an exemplary flowchart illustrating the processing of the codewords in S.
Figure 4:
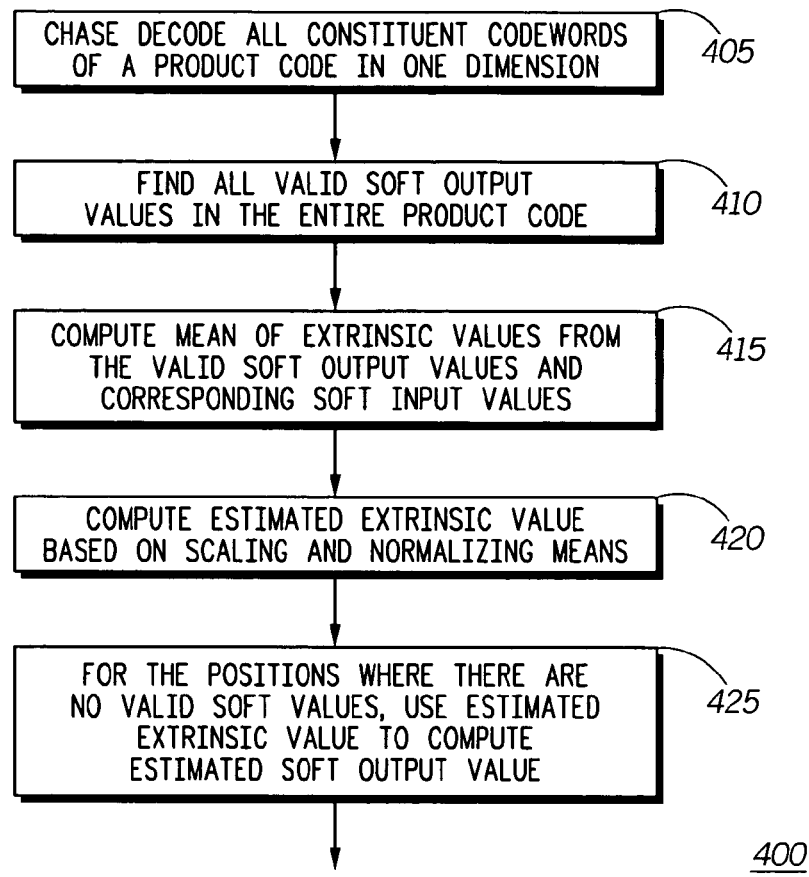
FIG. 4 is a flow diagram of the basic process of estimating the soft output vector.

A method consistent with certain embodiments of the present invention uses the number of errors s found during a hard-decision decoding and the guaranteed error correcting capability t of the code to potentially eliminate a set of codewords from consideration during the soft output calculation. Since in certain embodiments of the present invention each codeword (before elimination) has a correspondence with a test pattern, the set of eliminated codewords can be described as a set of eliminated test patterns. This describes one mapping of test patterns to codewords in the set S. With the reduced set S', a group of test patterns maps to a codeword in set S'. Hence when a codeword is found in set S', a group of test patterns which map to this codeword can be eliminated. Because certain embodiments consistent with the present invention only use the number of errors found, and not the error locations or bit-by-bit comparisons of decoded vectors, there is little additional decoder complexity. As shown in block 220 in FIG. 2, the hard decision decoder operates on $X_i=(Y+Z_i)$. Because the binary vector Y is constant for all $X_i$, the notation of hard decision decoding of test patterns $Z_i$ is equivalent to the hard decision decoding of $X_i=(Y+Z_i)$.

For any code with guaranteed error correcting capability t, if test pattern $Z_j=TP1$ produces a codeword by locating s errors, a set of other test patterns can be eliminated if members of the set of other test patterns (with a representative member denoted as $Z_j=TP2$) can not generate a different codeword than TP1. This set of eliminated test patterns produces duplicate (redundant) codewords. Since any vector (Y+TP2) cannot generate a different codeword if it is within t or fewer positions of the codeword generated by TP1 (e.g., (Y+TP1+E1), where E1 is an error vector with weight wt[E1]=s), the set of all TP2 such that $$wt[(Y+TP1+E1)+(Y+TP2)] \leq wt[TP1+TP2]+s \leq t \qquad (1)$$

can be eliminated. One of skill in the art will note, upon consideration of the present teaching, that in equation (1), the vector sums are performed using finite field arithmetic while the addition of s is done using summation over the field of integers. In certain embodiments of the present invention, the expression wt[TP1+TP2] is the number of bit-by-bit differences between TP1 and TP2.

Therefore, if s errors are found when decoding TP1, all other codewords associated with test patterns that differ in at most (t−s) positions from TP1 can be eliminated. This result can be illustrated in detail for several typical t-bit correcting codes.

In certain embodiments of the present invention, the value of s is less than or equal to t. This is the case, for example, when a bounded distance (BD) decoder is used as the hard decision decoder and a number of errors s found is less than or equal to the guaranteed error correcting capability t. However, a non-BD decoder may find s greater than t; in this case, no test patterns will be eliminated.

For t=1 codes with minimum distance $d_{min}$=3, (t–s) is either 1 or 0. Hence, if s=0 (e.g., TP1 results in a zero syndrome in the hard decision decoder), all TP2 within 1 bit of TP1 can be eliminated. For t=2 codes with $d_{min}$=5, (t–s) is 2, 1, or 0. Hence, if s=0, all TP2 within 2 bits of TP1 can be eliminated. Further, if s=1, all TP2 within 1 bit of TP1 can be eliminated. The various cases of Equation (1) can be continued for larger t.

A code with an odd minimum distance can be extended by adding an overall even-parity check, thereby increasing a minimum distance of the code by one. Such an extended code is often hard-decision decoded by only hard-decision decoding the un-extended portion of the code. For example, a BCH code with $d_{min}$=4/$d_{min}$=6 can be hard-decision decoded without including the overall even parity check, and treated as an un-extended $d_{min}$=3/$d_{min}$=5 BCH code. In this case, the number of errors s found does not include the overall even parity check position.

It should be noted that in certain embodiments of the present invention the construction of a mapping of bit differences in the test patterns can be performed before decoding. In one example, there can be $2^L$ possible test patterns. These test patterns can be represented by an L-bit binary word. The L-bit binary word can be mapped into a binary test pattern with the same length as binary vector Y. For example, a test pattern can be set to zeroes except for the L least reliable positions of the soft input. An example of the $2^L$ possible test patterns represented by an L-bit binary word is shown in the first column of Table 1. Each row of Table 1 contains L L-bit binary words that differ from the test pattern in the first column by one position. In general, the number of test patterns that can be eliminated based on one hard decision decoding is $$\sum_{i=1}^{t-s} \binom{L}{i}.$$

For a t=1 code with L=4, there are 16 possible test patterns and 4 eliminations if s=0, as illustrated in Table 1. For a t=2 code with L=4, it can be seen by referring to Table 1 and Table 2 that if s=1 there are 4 eliminations, and if s=0 there are 4+6=10 eliminations.

TABLE 1

Example of mapping test patterns with a single bit difference for 16 test patterns.

| TP1 | Set of test patterns differing by 1 bit from TP1 | | | |
|---|---|---|---|---|
| 0000 | 0001 | 0010 | 0100 | 1000 |
| 0001 | 0000 | 0011 | 0101 | 1001 |
| 0011 | 0010 | 0001 | 0111 | 1011 |
| 0010 | 0011 | 0000 | 0110 | 1010 |
| 0110 | 0111 | 0100 | 0010 | 1110 |
| 0111 | 0110 | 0101 | 0011 | 1111 |
| 0101 | 0100 | 0111 | 0001 | 1101 |
| 0100 | 0101 | 0110 | 0000 | 1100 |
| 1100 | 1101 | 1110 | 1000 | 0100 |
| 1101 | 1100 | 1111 | 1001 | 0101 |
| 1111 | 1110 | 1101 | 1011 | 0111 |
| 1110 | 1111 | 1100 | 1010 | 0110 |
| 1010 | 1011 | 1000 | 1110 | 0010 |
| 1011 | 1010 | 1001 | 1111 | 0011 |
| 1001 | 1000 | 1011 | 1101 | 0001 |
| 1000 | 1001 | 1010 | 1100 | 0000 |

TABLE 2

Example of mapping test patterns with a double bit difference for 16 test patterns.

| TP1 | Set of test patterns differing by 2 bits from TP1 | | | | | |
|---|---|---|---|---|---|---|
| 0000 | 0011 | 0101 | 1001 | 0110 | 1010 | 1100 |
| 0001 | 0010 | 0100 | 1000 | 0111 | 1011 | 1101 |
| 0011 | 0000 | 0110 | 1010 | 0101 | 1001 | 1111 |
| 0010 | 0001 | 0111 | 1011 | 0100 | 1000 | 1110 |
| 0110 | 0101 | 0011 | 1111 | 0000 | 1100 | 1010 |
| 0111 | 0100 | 0010 | 1110 | 0001 | 1101 | 1011 |
| 0101 | 0110 | 0000 | 1100 | 0011 | 1111 | 1001 |
| 0100 | 0111 | 0001 | 1101 | 0010 | 1110 | 1000 |
| 1100 | 1111 | 1001 | 0101 | 1010 | 0110 | 0000 |
| 1101 | 1110 | 1000 | 0100 | 1011 | 0111 | 0001 |
| 1111 | 1100 | 1010 | 0110 | 1001 | 0101 | 0011 |
| 1110 | 1101 | 1011 | 0111 | 1000 | 0100 | 0010 |
| 1010 | 1001 | 1111 | 0011 | 1100 | 0000 | 0110 |
| 1011 | 1000 | 1110 | 0010 | 1101 | 0001 | 0111 |
| 1001 | 1010 | 1100 | 0000 | 1111 | 0011 | 0101 |
| 1000 | 1011 | 1101 | 0001 | 1110 | 0010 | 0100 |

An Example in Accordance With Certain Embodiments of the Present Invention.

Suppose a block code is a (7,4) binary BCH code with $d_{min}$=3 and t=1, and a transmitted codeword is the binary vector R=[1, 0, 0, 1, 1, 1, 0]$^T$, where superscript T denotes transpose. After the transmission across a channel, a received soft input vector is [−0.011810, −0.001221, 0.018524, −0.012573, −0.015930, 0.003296, 0.035583]$^T$. Assuming that the soft input vector represents LLRs centered around zero, positive LLRs map into binary zeros, and negative LLRs map into binary ones. The binary vector Y corresponding to (created from) the soft input vector is [1, 1, 0, 1, 1, 0, 0]$^T$. In this example, the creation of binary vector Y is based on the sign of the soft input vector. The binary vector Y differs from the binary vector R in two places. With the numbering starting at 1, the L=3 smallest magnitudes of the soft input vector are positions 2, 6, and 1 (in increasing magnitude order) and those least-reliable positions are used to construct the test patterns. For L=3, there are $2^L$=8 possible test patterns. The mapping between the L=3-bit binary word and the 8 possible test patterns $Z_i$ is $$000 \Leftrightarrow \begin{bmatrix}0\\0\\0\\0\\0\\0\\0\end{bmatrix}, 001 \Leftrightarrow \begin{bmatrix}0\\1\\0\\0\\0\\0\\0\end{bmatrix}, 011 \Leftrightarrow \begin{bmatrix}0\\1\\0\\0\\0\\1\\0\end{bmatrix}, 010 \Leftrightarrow \begin{bmatrix}0\\0\\0\\0\\0\\1\\0\end{bmatrix}, 110 \Leftrightarrow \begin{bmatrix}1\\0\\0\\0\\0\\1\\0\end{bmatrix},$$

$$111 \Leftrightarrow \begin{bmatrix}1\\1\\0\\0\\0\\1\\0\end{bmatrix}, 101 \Leftrightarrow \begin{bmatrix}1\\1\\0\\0\\0\\0\\0\end{bmatrix}, 100 \Leftrightarrow \begin{bmatrix}1\\0\\0\\0\\0\\0\\0\end{bmatrix}.$$

In certain embodiments, a test pattern mapping is an L-bit binary word. When performing a hard decision decoding of $X_i$=(Y+$Z_i$), a hard decision decoder indicates that test pattern mappings 000, 001, 010, 110, 111, and 101 have s=1 error while test pattern mappings 011 and 100 have s=0 errors. If the prior art method were used, the set S would have 8 codewords but only 2 of those 8 codewords would be unique. The soft output calculation would have to process 8 codewords. With this example of certain embodiments of the present invention, the reduced set S' would have only 2 codewords. As a result, only two codewords would be processed for the soft output calculation, namely (Y+test pattern mapping 011) and (Y+test pattern mapping 100). Since test pattern mapping 011 has zero errors, the codewords resulting from hard decision decoding (Y+test pattern mapping 001), (Y+test pattern mapping 010), and (Y+test pattern mapping 111) can be eliminated because resulting codewords are identical to the codeword produced by hard decision decoding (Y+test pattern mapping 011). Note that test pattern mappings (011 and 001), (011 and 111), and (011 and 010) differ by one bit. A similar elimination can occur for test pattern mappings 000, 110, and 101 because those patterns differ from test pattern mapping 100 by 1 bit. Table 3 can be used to identify which test pattern mappings can be eliminated (corresponding to set TP2) when a particular test pattern mapping (i.e., the corresponding TP1 and binary vector Y) produces zero errors.

TABLE 3

Example of mapping test patterns with a single bit difference for 8 test patterns (i.e., L = 3). Bold shading in columns 2 through 4 indicates which test pattern (i.e., TP2) is eliminated for the above example.

| TP1 | Set of test patterns differing by 1 bit from TP1 | | |
|---|---|---|---|
| 000 | 001 | 010 | 100 |
| 001 | 000 | 011 | 101 |
| 011 | 010 | 001 | 111 |
| 010 | 011 | 000 | 110 |
| 110 | 111 | 100 | 010 |
| 111 | 110 | 101 | 011 |
| 101 | 100 | 111 | 001 |
| 100 | 101 | 110 | 000 |

For this example, the result of the soft output calculation produces the output vector [−0.007294, 0.007294, +INFINITY, −INFINITY, −INFINITY, −0.007294, +INFINITY]$^T$. There are c=4 signed indicators denoted by +/−INFINITY and n−c=3 valid soft output values. For example, the value INFINITY can represent an unachievable number such as a very large number or it could be a number near 1.0 on a fixed-point digital signal processor. The n−c valid soft output values are based on the soft input values. In this example, the soft output value 0.007294 is the sum of certain soft input values, i.e., 0.011810−0.001221−0.003296=0.007294 (within rounding error).

Figure 7:
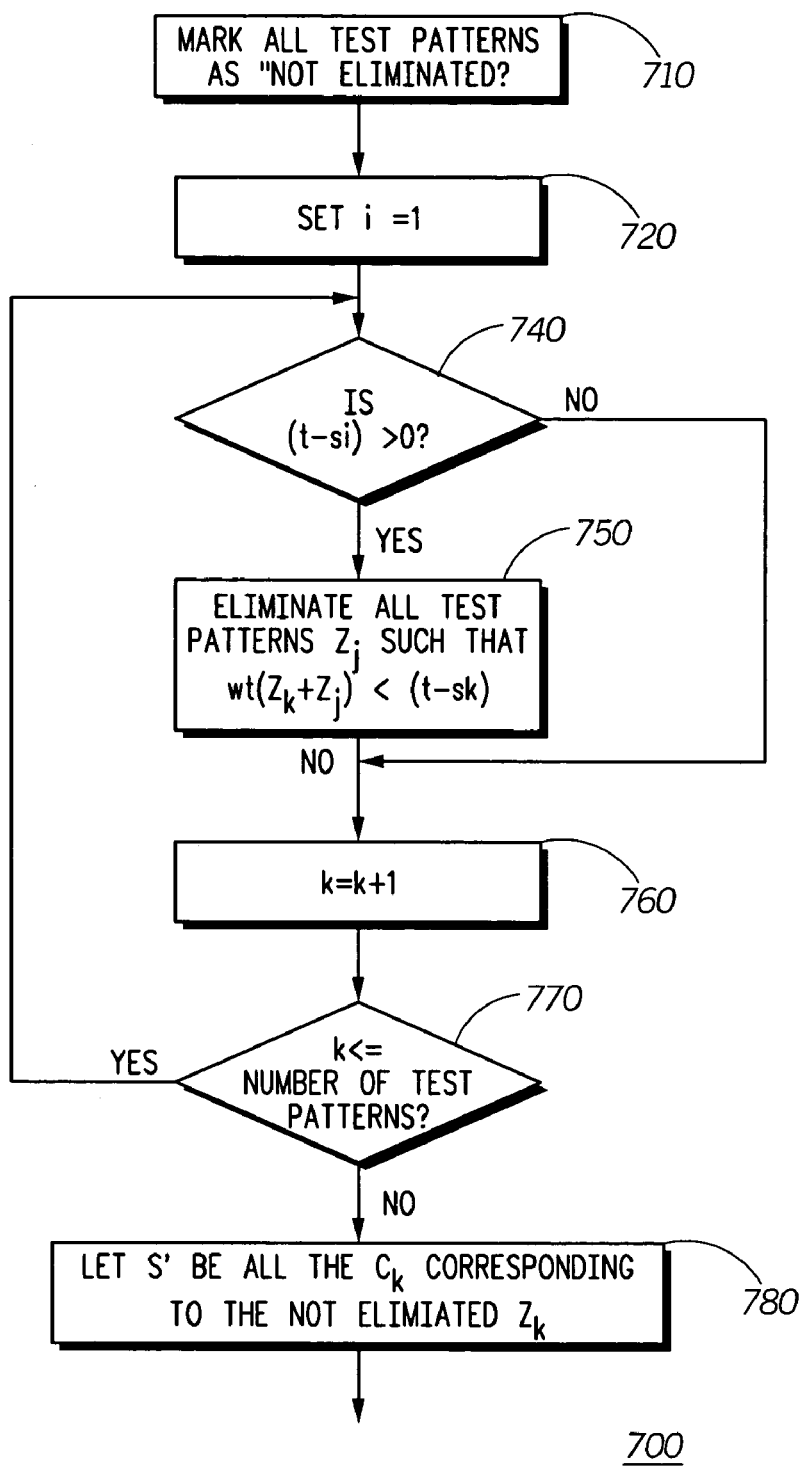
FIG. 7 is a flow diagram of the basic steps of generating a reduced set S' for a general block code, according to certain embodiments.

FIG. 7 illustrates a more general procedure 700 for generating the reduced set S', in accordance with certain embodiments of the present invention. Prior to generating the set S', all test patterns are marked as not eliminated (block 710). Conversely, in certain embodiments of the present invention all test patterns could be marked as eliminated and only those not eliminated in the process of generating the set S' are un-marked. Since in certain embodiments of the present invention each codeword (before elimination) has a correspondence with a test pattern, the set of eliminated codewords can be described as a set of eliminated test patterns. In certain embodiments of the present invention, this correspondence is 1 to 1.

A counter index i that ranges over the number of test patterns is initialized to 1 (block 720). In certain embodiments, the test patterns are reordered (sorted) in increasing order of the number of errors $s_i$ found during the hard decoding of $X_i$ prior to block 720. Because of the 1 to 1 correspondence, the test pattern reordering is equivalent to ordering the one or more codewords in S relative to the number of errors $s_i$. If $(t-s_i)$ is positive (Yes in block 740) all test patterns $Z_j$ are eliminated that satisfy $wt(Z_i+Z_j) \leq (t-s_i)$ as in block 750. $s_i$ can represent the number of errors found by hard decoding $Y+Z_i$. The test patterns that are to be eliminated could, in certain embodiments of the present invention, be determined using tables (e.g., Table 1, Table 2, and Table 3) or similar storage constructs or could be computed directly.

If $(t-s_i)$ is not positive (No in block 740), or if block 750 is executed, then i is incremented (block 760) and the test and possible elimination of test patterns (blocks 740-760) is repeated until the number of test patterns available is reached in block 770. Once all test patterns have been checked for elimination (No in block 770), then S' is defined to be the set of codewords corresponding to the all non-eliminated $Z_i$ (block 780). In FIG. 7, $s_i$ is evaluated for each test pattern $Z_i$ in 740. In order to reduce the number of $s_i$ evaluations, the $s_i$ can be evaluated in increasing order in the value of $s_i$, and the $s_i$ evaluations corresponding to eliminated test patterns can then be skipped. These additional steps will be shown in the example of FIG. 8.

Note that decoding failures where no codeword is produced could make the size of S, and hence S', be less than number of test patterns. If this occurs, those test patterns where no codeword is produced can be pre-eliminated. Optionally, certain embodiments of the present invention could insert an extra decision block looking for decoding failure before the test pattern elimination loop (e.g., block 720).

In certain embodiments of the present invention, the loop of FIG. 7 can also include a step to eliminate invalid codewords, such as flagged by the decoder for shortening or other reasons. Shortening sets certain known information values to zero, and does not transmit the known zero values. In the decoder, a codeword with a one in any of the known zero shortened positions (also known as the shortened range) is an invalid codeword. It is noted however, that the invalid codewords can still be used to eliminate test patterns so that in certain embodiments of the present invention the invalid codewords are not removed until block 780 of FIG. 7.

Figure 8:
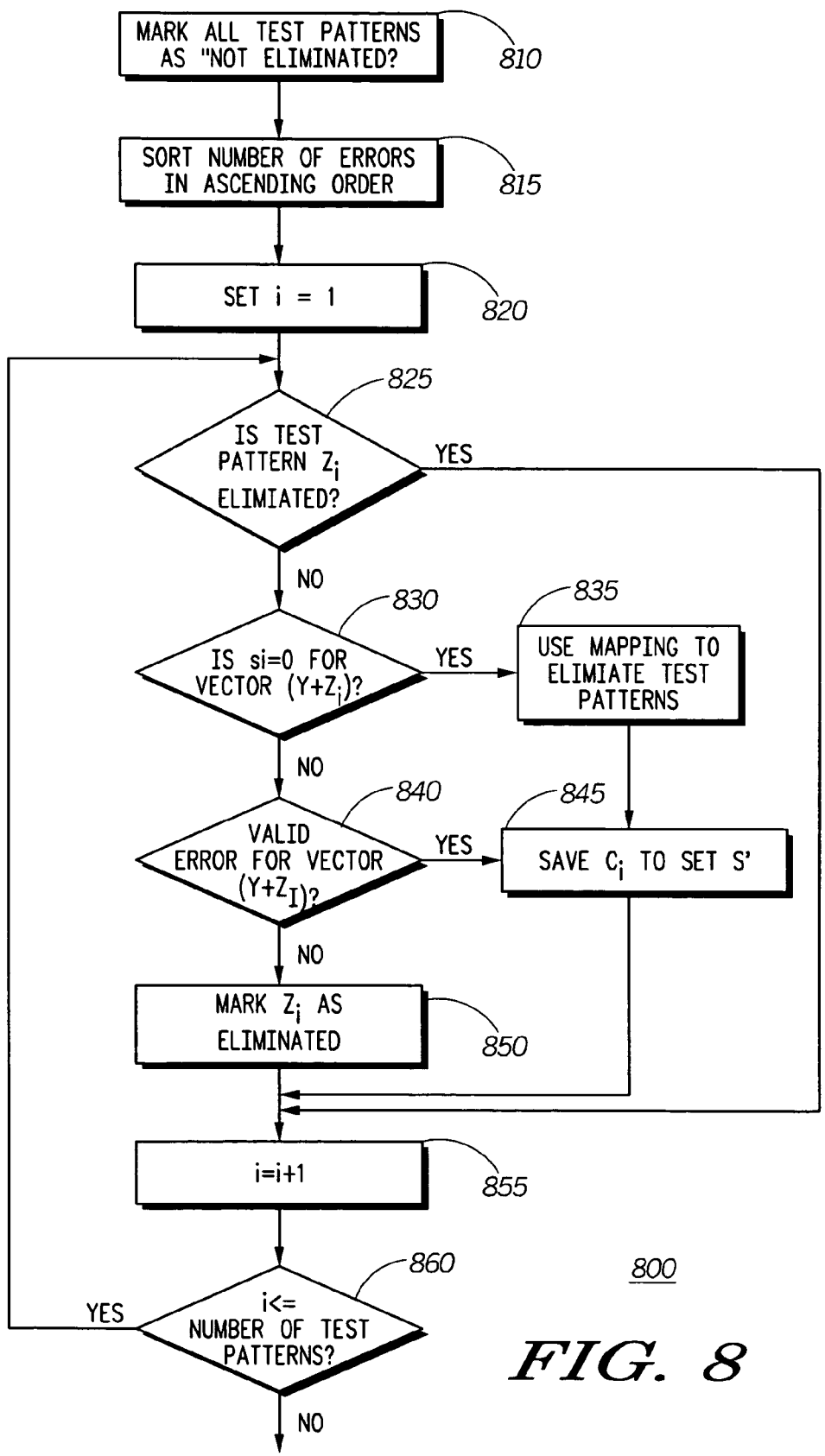
FIG. 8 is a flow diagram illustrating an example of generating a reduced set S' for a single error correcting (t=1) code, according to certain embodiments.

Referring now to FIG. 8, the case of a t=1 code with $d_{min}=3$ is illustrated with flowchart 800. FIG. 8 is a more detailed look at the (Remove redundant codewords in S) block 520 of FIG. 5. The initialization step of marking all test patterns as "not eliminated" (block 810) can associate a flag with each test pattern. In one example, a flag with a value "not eliminated" can represent that a test pattern in conjunction with the binary vector Y allows a hard decision decoder to produce a valid codeword. In another example, this flag with a value "eliminated" can represent that hard-decision decoding of a test pattern in conjunction with the binary vector Y produces a valid but duplicate codeword or produces an invalid codeword. Prior to beginning the loop, a number of errors $s_i$ for each combination $(Y+Z_i)$ is determined. In certain embodiments, the codewords in S are reordered (sorted) in increasing order of the number of errors $s_i$ for one or more codewords in S (block 815). The loop starts with the smallest number of errors $s_i$ (block 820). The reordering prevents duplicate codewords being introduced into the reduced set S'.

The first check in the loop can determine if a test pattern $Z_i$ has been eliminated (block 825). The test pattern $Z_i$ can be eliminated if it results in a duplicate codeword. The second check in the loop can determine if the number of errors $s_i$ identified by the hard decision decoder is zero (block 830). For a t=1 binary BCH code, an equivalent check can determine whether the syndrome is zero. If the number of errors $s_i$ is zero, exemplary Table 1 (for L=4 or Table 3 for L=3) can be used to identify which test patterns can be marked as eliminated (block 835). For $2^L$ test patterns, this step can eliminate L test patterns. Further, if the number of errors $s_i$ is zero, then the binary vector $(Y+Z_i)$ produces a valid codeword and that codeword can be saved to a reduced set S'.

The third check (block 840) examines the one possible error location identified by the hard decision decoder. Recall for a t=1 code, the hard decision BCH decoder can identify whether there is zero or one error. If the error location identified by the hard decision decoder is valid and the resulting codeword is valid, that codeword can be saved to a reduced set S' (block 845). If the error location is invalid, the test pattern $Z_i$ can be marked as eliminated (block 850). This valid error check step is optional, but is useful for reducing complexity. The process of eliminating test patterns and populating the set S' then continues until all test patterns have been checked (blocks 855 and 860).

The example shown in FIG. 8 is not intended to limit the scope of the invention and one of skill in the art will recognize, upon consideration of the present teaching, that this approach can be extended for codes with greater $d_{min}$ and/or with greater error correcting capabilities. The $d_{min}=4$ case can be processed as the $d_{min}=3$ case, excluding the extended bit.

Eliminating test patterns in the manner shown in FIG. 8 does not generally degrade the performance of the decoder. Eliminating test patterns provides a benefit by reducing an average decoding complexity. Furthermore, because the test pattern loop and soft output loop are decoupled, the soft output loop can also have a maximum number of input codewords (these input codewords are in S or S') that is different from (less than) a number of test patterns in the test pattern loop. An efficient method for eliminating duplicate codewords can further comprise limiting a maximum number of codewords S' that is provided to the soft output computation, where the maximum number is less than the number of test patterns. If a number of codewords in S' exceeds a maximum number, the maximum number of codewords in S' could then be processed to generate the soft outputs. This limits a worst-case complexity in addition to an average complexity, and can do so without a significant performance degradation if the maximum is chosen appropriately.

For example, for many t=1 codes using 16 test patterns, a zero syndrome is found with one of the test patterns 95% or more of the time. Therefore, using a maximum of 12 codewords in the soft output generation will not significantly affect performance. Using the already present number of errors found to eliminate predefined sets of outputs from the test patterns (codewords) is much more efficient than either not eliminating codewords, or by physically comparing codewords to look for duplicates. Examples of predefined sets are Table 1, Table 2, and Table 3. It is also more efficient than keeping the test pattern loop and soft output loop as one loop.

Furthermore, hard decision decoding failures of $X_i=(Y+Z_i)$ also result in fewer codewords provided to the soft output loop.

There may be other ways of eliminating duplicate codewords in S. In one embodiment of the present invention syndromes are computed for all test patterns and then duplicates are eliminated. An alternate embodiment eliminates test patterns as a zero syndrome (or certain number of errors) is found, but sometimes some of the test patterns that could be eliminated have already been tested.

As another example, in certain embodiments of the present invention each codeword in S can be compared to the other codewords in S to locate (and then remove) duplicate codewords. However, a search to locate duplicate codewords can be difficult to implement, and because the search is not guaranteed to find any duplicate codewords, the worst-case complexity may be worse than without the codeword removal. For example, if there are 16 unique codewords in S, a decoder would have to perform n*15*16/2 comparisons before knowing the codewords were unique. The decoder would therefore have to perform 120n comparisons in addition to processing the worst case of 16 codewords in the soft output computation. Because the decoder is so heavily optimized when performing decoding of a product code on a DSP, the additional 120n comparisons can actually be more than the entire cost of a constituent decode.

In certain embodiments of the present invention, examining a number of errors found by a hard-decision decoder (and then comparing the number of errors found to a threshold and possibly eliminating a set of codewords) may be accomplished by similar statistics produced within the decoder. In certain embodiments, the threshold can be the guaranteed error correcting capability of the hard decision decoder.

For example, one type of hard-input hard-output BCH decoder first expresses a binary vector W as a polynomial $W(x)$ in $GF(2^m)$. W can equal for example, the polynomial representation of the vector $Y+Z_i$. The decoder evaluates the polynomial $W(x)$ using certain values. These values can be related to roots of a generator polynomial used to construct the BCH code. The results of the evaluation of the polynomial $W(x)$ are the syndromes. The syndromes can then be used to construct an error locator polynomial. The next step attempts to find one or more roots of the error locator polynomial. The roots of the error locator polynomial can indicate a location of errors in the binary vector W. A number of roots of the error locator polynomial can indicate a number of bit errors s in the binary vector W. If the number of roots and the location of the roots are valid for the BCH code, the hard-input hard-output decoder can produce a valid codeword by correcting the s errors indicated by the roots of the error location polynomial. An observation for a binary t=1 BCH code is that one syndrome can be sufficient for constructing the error locator polynomial. Further, when that syndrome has a value of zero, the binary vector W is already a codeword and there are either no errors in W or a number of errors such that W looks like a codeword (albeit an incorrect codeword). Therefore, in certain embodiments of the present invention, examining the number of roots (or comparing a single syndrome to see if it is zero for a t=1 code) is equivalent to examining the number of errors found by a hard-decision decoder. The number of roots are one example of a similar statistic produced within the decoder.

In the following, "soft output" includes but is not limited to "output log likelihood ratio (LLR)", "soft input" includes but is not limited to "input LLR", "extrinsic" includes but is not limited to "extrinsic LLR". Furthermore, a "value" is an element of a "vector". Soft information can be either a soft output or an extrinsic LLR. In certain embodiments of the present invention, if a soft information value is centered around zero, a sign of the soft value can indicate a hard estimate of the given bit and a magnitude of the soft value can indicate a reliability of the hard estimate. In certain embodiments, a codeword can be represented by a vector. The "bit position" can be used to identify the location of a value within a vector. Hence, the number of bit positions is equivalent to the number of values.

As mentioned previously, after Chase decoding of a constituent codeword a soft output vector has c unavailable outputs and n–c valid soft output values. As a result, there are only n–c valid extrinsic values available for subsequent decoding. In order to decode successfully, the extrinsic values can be estimated for the c unavailable outputs. Depending upon the number of unavailable outputs c, certain embodiments of the present invention include a method of estimating soft information in a block code decoder. If all bit positions need to be estimated (c=n), then the value for the estimated positions are based on the soft input values. Conversely, if not all bit positions need to be estimated (c<n) then the value for the estimated positions can be based on the non-estimated positions. The maximum number of bit positions of a codeword that can be estimated is preferably the length n of a single constituent block code, but can also be less (such as 16 bits, ½ a code, etc.) or longer (such as 128 bits, two constituent codes, all constituent codes in a dimension of a product code).

In certain embodiments of the present invention, extrinsic value estimates can be provided when the constituent code has a large natural length, has a small number of test patterns, has many error patterns beyond the capability of the hard input hard output decoder, or is extremely (for t=1 codes) or moderately (for t>1 codes) shortened, where t is the guaranteed error correcting capability of the hard decision decoder. For shortened codes, the true minimum distance ($d_{min}$) may be unknown and can be greater than the $d_{min}$ of the unshortened code. More elimination of test patterns may be possible for shortened codes.

In certain embodiments of the present invention, an extrinsic value estimator knows the bit positions of the codeword to be estimated via a signed indicator. In certain embodiments of the present invention, the signed indicator can be a signed indicator value (such as +/−INFINITY) in each position to be estimated to distinguish it from the other positions. The signed indicator can also be represented in certain embodiments by a table of positions that need to be estimated and signs that should be provided to the estimates.

The estimated codeword positions of certain embodiments of the present invention may be due to a soft-output Chase decoder, Kaneko algorithm, or other soft-output decoding algorithm that may not always find a competing codeword for each bit position. For a Chase decoder, the lack of a competing codeword in a position is often due to decoding failures in an underlying hard decision decoder. Decoding failures typically arise when the decoder cannot correct the error pattern that is encountered, a frequent occurrence when a bounded-distance decoder (i.e., a decoder that can only correct up to a set number of errors) is used to decode imperfect codes or shortened codes.

In certain embodiments of the present invention, determining values for estimated positions based on the soft input values involves using a linear function of the soft input values, and further preferably involves: calculating an input magnitude mean of the soft input values, possibly scaling the input magnitude mean, inserting the possibly scaled input magnitude mean into the estimated positions, and adjusting a sign of the estimated positions. A preferred value of scaling when the estimated positions are based on the soft input values is 1.0, which is equivalent to not scaling.

Determining the values for the estimated positions based on the non-estimated positions preferably involves using a linear function of the non-estimated positions, and further preferably involves: calculating an extrinsic magnitude mean of the non-estimated positions, possibly scaling the extrinsic magnitude mean, inserting the possibly scaled extrinsic magnitude mean into the estimated positions, and adjusting the sign of the estimated positions. A preferred value of scaling when the estimated positions are based on the non-estimated positions is 0.5, but of course this should not be considered limiting.

It is noted that the values of the estimated positions may, in certain embodiments of the present invention include a mixture of the estimated values using non-estimated positions and estimated values using soft input values. For example, some of the constituent codewords of a product code may have estimated values using non-estimated positions and others may have estimated values using soft input values. It is further noted that although the description of the present invention assumes the SISO produces soft outputs, the SISO decoder could produce extrinsics without departing from the spirit and scope of the present invention. In certain embodiments of the present invention an extrinsic value is the difference between the soft output value and soft input value.

Figure 9:
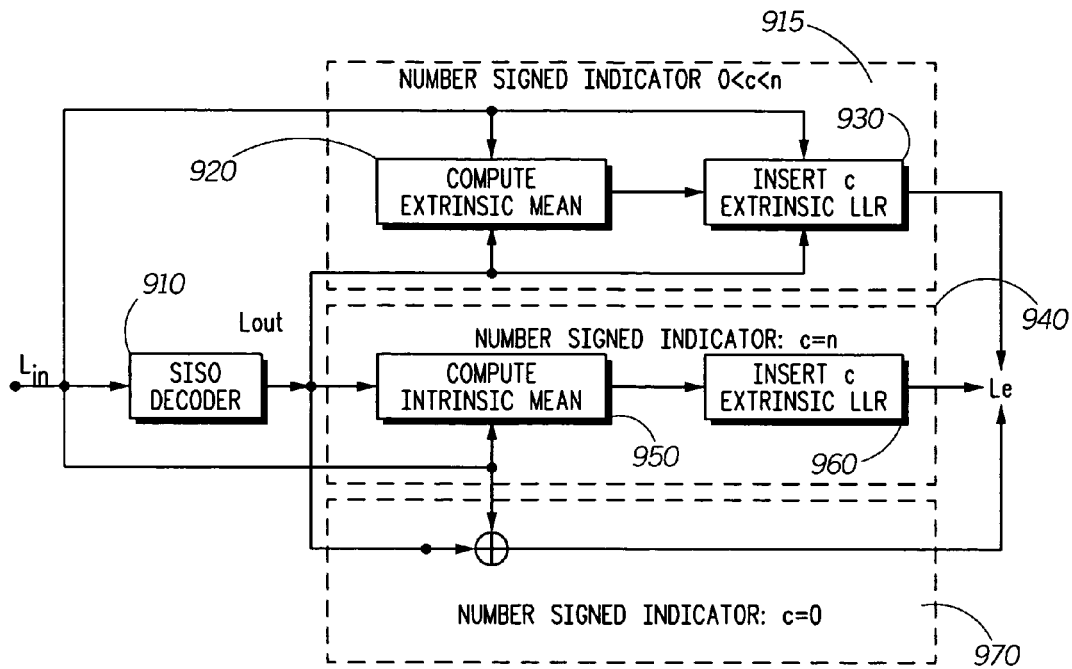
FIG. 9 is a block diagram of generating an extrinsic vector of a Chase decoder for three possible cases of the number of signed indicators, according to certain embodiments.

In certain embodiments of the present invention, estimating extrinsic values of a given codeword comprises evaluating three possible cases of the number of signed indicators c from a soft decision decoder, such as the Chase decoder, as shown in FIG. 9, 900. The extrinsic values are found as follows for each case of c at the output of a SISO decoder (block 910).

1. When c=0 (block 970). The soft output vector, denoted by $L_{out}$, is calculated based on the codewords in set S (or the reduced set S'). Since the extrinsic vector, denoted by $L_e$, can be computed entirely from the soft input vector and soft output vector, no extrinsic value estimation is needed.

2. When 0<c<n (block 915). In this case, there are at least two distinct codewords in set S (or the reduced set S'). However, the number of codewords is insufficient to produce soft output values for every bit position of the most likely codeword. As a result, there are c positions in the soft output vector that are signed indicators, and hence, c extrinsic values are to be estimated. Estimation of the extrinsic values can follow a two-part procedure.

(block 920) Find the (n–c) positions of the constituent codeword that have valid soft output values, or equivalently having valid extrinsic values (non-estimated extrinsics). The (n–c) extrinsic values are computed. The mean of the extrinsic values magnitudes is computed next. The extrinsic magnitude mean is then scaled by a positive parameter $\beta$. The scaling parameter $\beta$ is used to dampen the reliability provided by the extrinsic magnitude mean. While parameter $\beta$ can be any positive number, in certain embodiments of the present invention the parameter $\beta$ is typically in the range of $0<\beta \leq 1$. For 0<c<n, a nominal (preferred) value of $\beta$ is 0.5.

(block 930) The second part applies the scaled extrinsic magnitude mean to produce the c extrinsic estimates. In this step, the sign of the scaled extrinsic magnitude mean is adjusted to be the same as each signed indicator.

3. When c=n (block 940). In this case zero or one unique codewords are in the set S (or the reduced set S'). As a result, the entire soft output vector comprises signed indicators. Unlike the case where 0<c<n, an extrinsic value for the signed indicators cannot be estimated from the soft output values. The estimation of the extrinsic values follows a two-part procedure.

(block 950) The first part processes the entire soft input vector, denoted by $L_{in}$. The mean of the soft input magnitudes is computed. The input magnitude mean is then scaled by a positive parameter β. The scaling by parameter β is used to dampen the reliability provided by the input magnitude mean. While parameter β can be any positive number, in certain embodiments of the present invention, the parameter β is in the range of 0<β≦1. For c=n, a nominal (preferred) value of β is 1.0. When the parameter β is 1.0, the scaling is not necessary.

(block 960) The second part applies the scaled input magnitude mean to estimate the entire extrinsic vector. In this part, the sign of the scaled input magnitude mean is adjusted to be the same as each signed indicator.

Although the parameter β is positive in this embodiment, one of average skill in the art can use a negative value of β and adjust the sign of the mean accordingly. Note that $L_{out}$ is related to the most likely codeword in set S (or the reduced set S').

In certain embodiments the extrinsic value estimator comprises elements 915, 940, and 970 in FIG. 9. In one embodiment, branching on the value of c may be performed before computations at 920 or 950. If c>0, then the computations of either 920 or 950 are performed. In another embodiment, all or part of the computations 920 and 950 are performed before the value of c is known.

Thus, certain embodiments of the present invention comprise a structure and method of processing soft information in a block code (soft-input soft output) decoder. A soft input vector is received and a binary representation of the soft input vector is combined with a test pattern and hard decoded by the hard decision decoder. Successful hard decoding is used to populate the set S. The set S is then processed to remove redundant codewords to produce set S', and soft outputs are generated by the block code decoder based on c estimated soft output values and (n−c) non-estimated soft output values. The c estimated soft output values are operable to be computed by the block code decoder from one or more positions of the length n soft input vector and one or more codewords in the set S'.

It is noted that removing redundant codewords in S to form a reduced set S' may further comprise using a number of errors found during a hard decoding and a guaranteed error correcting capability t of the code so that if a test pattern $Z_i$=TP1 produces a codeword by locating s errors, eliminating a set of duplicate (redundant) codewords if members of a corresponding set of test patterns TP2 have Hamming weight satisfying:

$$wt[TP1+TP2]+s \leq t.$$

Figure 10:
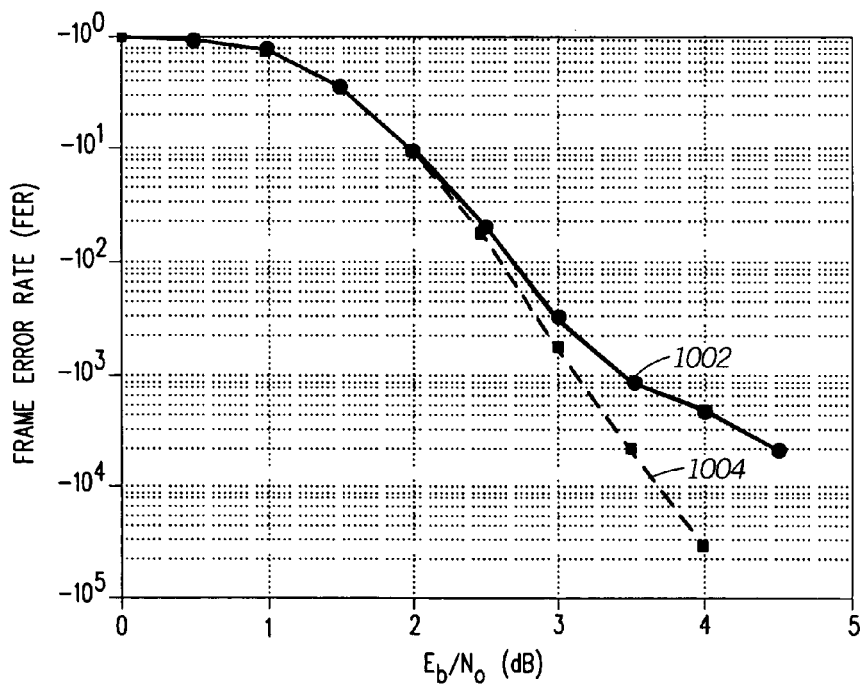
FIG. 10 is a graph showing frame error rate (FER) performance of a method of the present invention when used to decode a code defined in the TIA-902.BAAD standard, according to certain embodiments.

It is noted that certain embodiments of the present soft information estimation method provides good performance and eliminates the unexpected error floor in product code decoding. For example, for extremely shortened constituents as present in the TIA standard, unexpected error floors were observed using the existing prior art method, but were eliminated using the method of the present invention. An exemplary simulation was run under the condition of binary phase shift keying (BPSK) modulation and additive white Gaussian noise (AWGN) to evaluate an instantiation of the method of estimating soft information of the present invention. Two cases were simulated. A first is method 1004 of estimating soft information in accordance with certain embodiments of the present invention, and a second is a "no-special case" version 1002 of the decoder. The "no-special case" version 1002 is scale-tolerant and operates over a codeword of length n, but handles the c=n case by setting the n extrinsic values to zero. The frame error rate of both cases is plotted in FIG. 10. It shows that an unexpected error floor at high SNR is removed by method 1004. The code is a two dimensional product code (block turbo code) with (19, 12, 4) BCH by (29, 23, 4) BCH constituent codes. The product code is for the 100 kHz 3 MBBK channel of the TIA-902.BAAD standard.

It is also noted that certain embodiments of the estimation method can enhance the performance of SISO decoders in applications beyond product code decoding. For example, the estimation method allows the soft output to be used in unequal error protection channel coding schemes, hybrid automatic repeat request schemes, and joint equalization/decoding schemes.

Figure 11:
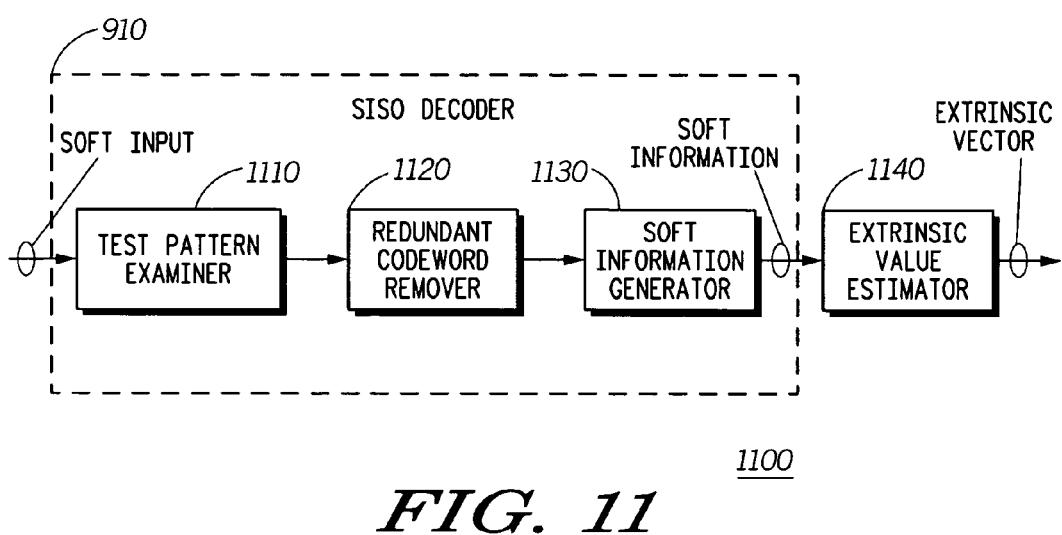
FIG. 11 depicts a structure for processing soft information in a block code decoder, according to certain embodiments.

FIG. 11, depicts a structure 1100 for processing soft information in a block code decoder. The SISO decoder 910, shown also in FIG. 9, comprises a test pattern examiner 1110, a redundant codeword remover 1120, and a soft information generator 1130. The test pattern examiner 1110 processes the soft input to produce a binary vector Y and to construct a set of test patterns $Z_i$. In certain embodiments, the test pattern examiner 1110 can produce a number of errors $s_i$ found by hard decoding Y+$Z_i$. In certain embodiments, the redundant codeword remover 1120 can process the number of errors $s_i$ to remove redundant codewords (for example, using the procedure in FIG. 7) to produce a set S'. The codewords in set S' are processed in the soft information generator 1130 to determine a most likely codeword and to generate the soft information vector. The soft information generator 1130 can process the metrics associated with the codewords in S' to produce soft information values. For the positions of the soft information vector where the soft information generator 1130 is unable to find a competing codeword, the soft information generator 1130 can use a signed indicator for that position. The soft information is then processed by the extrinsic value estimator 1140 to produce an extrinsic vector. The extrinsic value estimator 1140 comprises elements 915, 940, and 970 in FIG. 9.

In certain embodiments of the present invention, the branching in the proposed method can be implemented with minimal additional complexity in a DSP (an 'if' branch) or FPGA/ASIC (reuse circuitry to compute scaled magnitude mean).

Those skilled in the art will recognize upon consideration of the above disclosure, that certain embodiments consistent with the present invention can be implemented either using specialized hardware or can be realized using a programmed processor (dedicated or general purpose). General purpose computers, microprocessor based computers, micro-controllers, optical computers, analog computers, dedicated processors, Application Specific Integrated Circuits (ASICs) and/or dedicated hard wired logic may be used to construct equivalent embodiments of the present invention. Moreover, program instructions to implement certain embodiments can be stored on any suitable computer readable storage medium or transmitted over any suitable transmission medium.

While certain illustrative embodiments have been described, it is evident that many alternatives, modifications, permutations and variations will become apparent to those skilled in the art in light of the foregoing description.

What is claimed is:

1. A method of processing soft information in a block code decoder, comprising:
   receiving a length n soft input vector;
   creating a binary vector Y corresponding to the length n soft input vector;
   hard decoding each linear function $X_i$ of Y and a test pattern $Z_i$ of one or more test patterns, wherein when the hard decoding is successful a codeword and an associated metric produced by the hard decoding are added to a set S;
   removing redundant codewords in S to form a reduced set S' based on processing a number of errors found, during the hard decoding of the linear function $X_i$ and a guaranteed error correcting capability t of the block code decoder; and
   generating n soft outputs based on c estimated soft output values and (n-c) non-estimated soft output values wherein the c estimated soft output values are operable to be computed from one or more positions of the length n soft input vector and one or more codewords in the set S'.

2. The method of claim 1, further comprising:
   designating a most likely codeword from the set S';
   estimating an extrinsic vector for the c estimated soft output values, wherein the estimating further comprises:
   if c=0,
      calculating an output vector from the codewords in S'; and
      calculating the extrinsic vector from the soft input vector and the output vector.

3. The method of claim 1, further comprising:
   designating a most likely codeword from the set S';
   estimating an extrinsic vector for the c estimated soft output values, wherein the estimating further comprises:
   if 0<c<n,
      computing (n-c) extrinsic values from the non-estimated soft output values;
      computing an extrinsic magnitude mean of the extrinsic values;
      scaling the extrinsic magnitude mean by a positive parameter β; and
      applying the scaled extrinsic magnitude mean to produce c extrinsic estimates, wherein the applying further comprises:
         adjusting a sign of the scaled extrinsic magnitude mean.

4. The method of claim 1, further comprising:
   designating a most likely codeword from the set S';
   estimating an extrinsic vector for the c estimated soft output values, wherein the estimating further comprises:
   if c=n,
      calculating an input magnitude mean from the length n soft input vector;
      scaling the input magnitude mean by a positive parameter β;
      applying the scaled input magnitude mean to estimate an extrinsic vector; and
      adjusting a sign of the scaled input magnitude mean.

5. The method of claim 1, wherein the soft input vector corresponds to a constituent code of a product code.

6. The method of claim 1, wherein the block code used in the decoder comprises a shortened BCH code.

7. The method of claim 1, wherein the one or more test patterns are created using a Chase algorithm.

8. The method of claim 1, wherein one or more codewords of the set S are ordered relative to a number of errors of the one or more codewords.

9. The method of claim 1, wherein if s errors are found when decoding the linear function $X_i$, other codewords associated with test patterns that differ in at most (t-s) positions from the test pattern $Z_i$ are eliminated, wherein t is a guaranteed error correcting capability of the block code.

10. The method of claim 1, wherein the block code comprises a constituent code of a product code and extrinsic information of the length n soft input vector is passed between constituent decoders.

11. The method of claim 1, wherein the c positions to be estimated are flagged using a signed indicator, said signed indicator comprising one of
    a signed indicator value; and
    a table of positions that need to be estimated and signs that should be provided for the c estimated soft output values.

12. The method of claim 1, wherein removing redundant codewords in S to form a reduced set S' further comprises:
    using the number of errors found during the hard-decision decoding and the guaranteed error correcting capability t of the block code further comprising:
       if a test pattern $Z_i$=TP1 produces a codeword by locating s errors, a set of codewords can be eliminated if members of a corresponding set of test patterns TP2 are eliminated based on Hamming weight satisfying:

$$wt[TP1+TP2]+s \leq t.$$

13. The method of claim 1, wherein a mapping of bit differences in the test patterns is performed before decoding.

14. The method of claim 12, wherein number of test patterns that can be eliminated based on one hard decision decoding when the number of test patterns is $2^L$ is $$\sum_{i=1}^{t-s} \binom{L}{i}$$

wherein L is a length of the test patterns.

15. The method of claim 1, wherein removing redundant codewords in S further comprises:
    marking all test patterns as "not eliminated";
    constructing mappings of bit differences between test patterns;
    determining if a number of errors s identified by the hard decoding of $X_i$ is less than the error correcting capability of the block code decoder; and
    if the number of errors s is less than the error correcting capability of the block code decoder, identifying which test patterns can be marked as eliminated and saving codewords associated with test patterns that are not marked as eliminated to a reduced set S'.

16. The method of claim 1, wherein removing redundant codewords further comprises limiting a maximum number of codewords that is provided to a soft output computation, where the maximum number is less than the number of test patterns.

17. The method of claim 1, wherein removing redundant codewords further comprises comparing codewords in S to locate and possibly remove duplicate codewords.

18. The method of claim 1, wherein hard decoding further comprises examining a statistic produced within the hard decoder, wherein the statistic is a number of roots found in hard decoding a BCH code.

19. The method of claim 1, wherein removing the redundant codewords further comprises:
examining a number of errors found by the hard decoder;
comparing the number of errors found to a threshold; and
if the number of errors found is less than the threshold, eliminating a set of codewords.

20. The method of claim 1, further comprising eliminating redundant codewords, where codewords are eliminated by determining if a location of an error found hard decoding is in a shortened range for the block code.

21. The method of claim 1, wherein redundant codewords are eliminated by computing syndromes for a plurality of test patterns and then eliminating duplicate codewords, said redundant codewords eliminated when a zero syndrome or certain number of errors is found.

22. A structure for processing soft information, comprising:
a block code decoder receives a length n soft input vector, wherein said block code decoder creates a binary vector Y corresponding to the length n soft input vector;
a hard input hard output decoder decodes each linear function $X_i$ of Y and a test pattern $Z_i$ of one or more test patterns, wherein when the hard decoder is successful a codeword and an associated metric produced by the hard decoding of linear function $X_i$, are added to a set S;
the block code decoder removes redundant codewords in S to form a reduced set S' based on processing a number of errors found during the hard decoding of the linear function $X_i$, and a guaranteed error correcting capability t of the block code decoder; and
the block code decoder generates n soft outputs based on c estimated soft output values and (n-c) non-estimated soft output values wherein the c estimated soft output values are computed from one or more positions of the length n soft input vector and one or more codewords in the set S'.

23. A structure of claim 22, wherein the block code decoder further comprising:
a test pattern examiner operable to process the length n soft input vector to produce a set of test patterns, wherein the set of test patterns are operable to create a set of codewords S;
a redundant codeword remover operable to eliminate redundant codewords from the set S thereby creating a set S'; and
a soft information generator operable to process the codewords in S' to produce soft information values.

24. The structure of claim 23, further comprising an extrinsic value estimator operable to process the soft information values to produce extrinsic information values, wherein the extrinsic value estimator computes one or more estimated extrinsic values by processing values of one or more non-estimated soft information values.

25. The structure of claim 23, wherein the redundant codeword remover eliminates a subset of codewords from S if a test pattern TP1 and each element TP2 of the subset of codewords from S have Hamming weight satisfying:

$$\text{wt}[TP1+TP2]+s \leq t,$$

where t is an error correcting capability of a block code and s is a number of errors detected in a hard decoding of the test pattern TP1 and a binary vector created from the length n soft input vector.

* * * * *